United States Patent [19]

Brice

[11] Patent Number: 5,714,744
[45] Date of Patent: Feb. 3, 1998

[54] WAVE PICKUP IN THE FORM OF A PRINTED COIL FOR AN ELECTRONIC PORTABLE OBJECT SUCH AS A NO-CONTACT CARD OR BADGE

[75] Inventor: Patrice Brice, Vincennes, France

[73] Assignee: Innovatron Industries, Société Anonyme, Paris, France

[21] Appl. No.: 710,182

[22] Filed: Sep. 12, 1996

[30] Foreign Application Priority Data

Sep. 15, 1995 [FR] France .................. 95 10781

[51] Int. Cl.$^6$ .................................................. G06K 7/08
[52] U.S. Cl. .................. 235/449; 235/380; 235/493; 235/492
[58] Field of Search .................. 235/380, 449, 235/493, 492

[56] References Cited

U.S. PATENT DOCUMENTS 5,184,001 2/1993 Lrvionnais ........................ 235/449

FOREIGN PATENT DOCUMENTS 0 374 018 A1 12/1989 European Pat. Off. .
91 15 582 U 12/1991 Germany .

*Primary Examiner*—Harold Pitts
*Attorney, Agent, or Firm*—Bardehle, Pagenberg, Dost, Altenburg, Frohwitter, Geissler & Partners

[57] ABSTRACT

The portable object comprises a circuit on a double-sided printed circuit with a coil etched on the printed circuit, the coil comprising a plurality of alternating turns etched on each of the faces of the card, with each turn being an open turn connected at each end by means of a respective via passing through the card to the corresponding adjacent end of the next turn disposed on the opposite face of the card, the successive turns thus being connected in series in alternating and concentric manner by means of a set of vias.

According to the invention, on a first face of the card, the curvilinear extents of the facing terminal regions of the turns extend beyond the midline between the ends of the turns so as to cause said terminal regions to be interdigitated in alternation, while on the opposite face of the card, the curvilinear extents of the facing terminal regions of the turns are limited so as to leave an empty gap extending approximately radially, the through connection vias being located outside said empty gap along the sides thereof, the card also having at least one etched conductor track interconnecting a point situated inside the coil and a point situated outside the coil, the track passing along the empty gap.

6 Claims, 3 Drawing Sheets

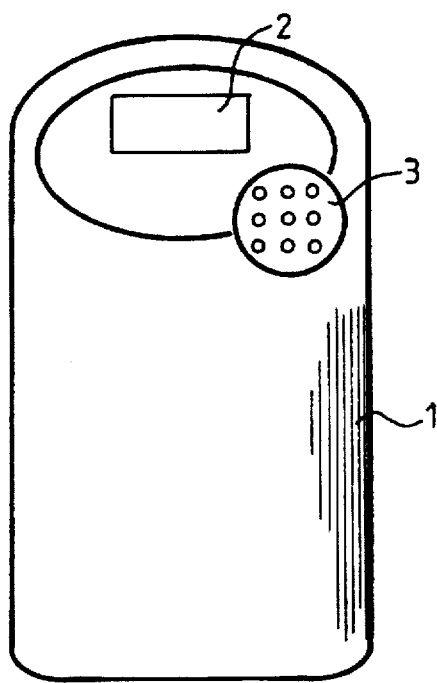
FIG_1
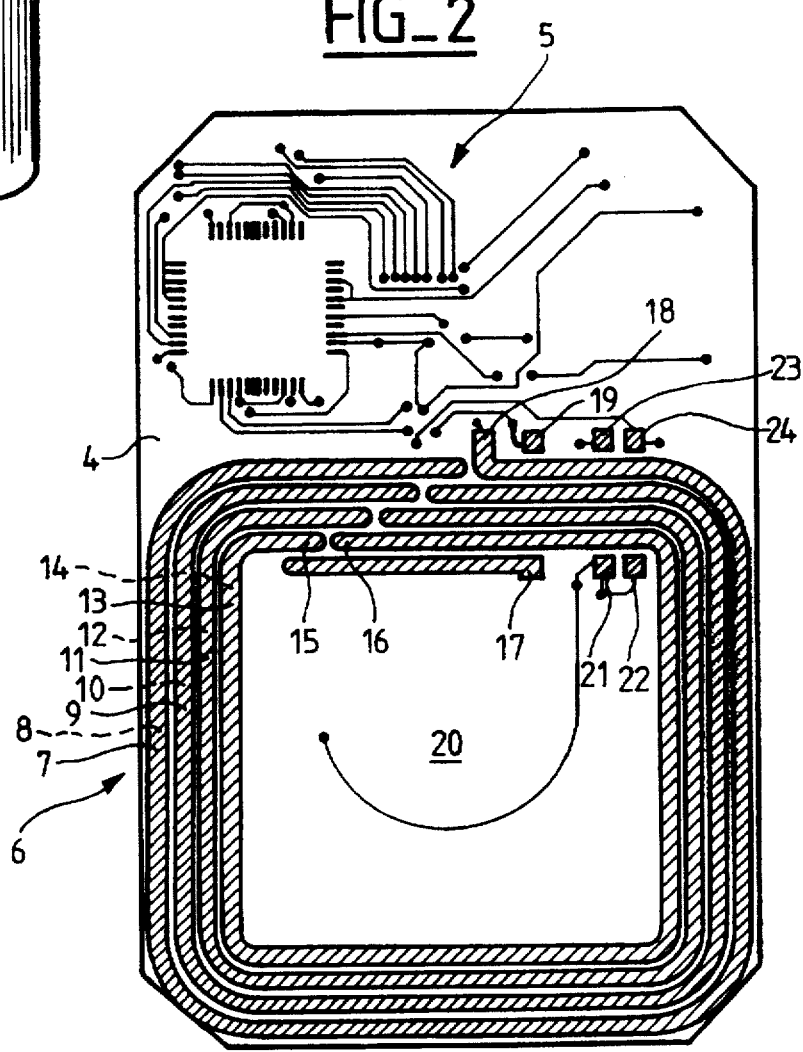
FIG_2

FIG_5
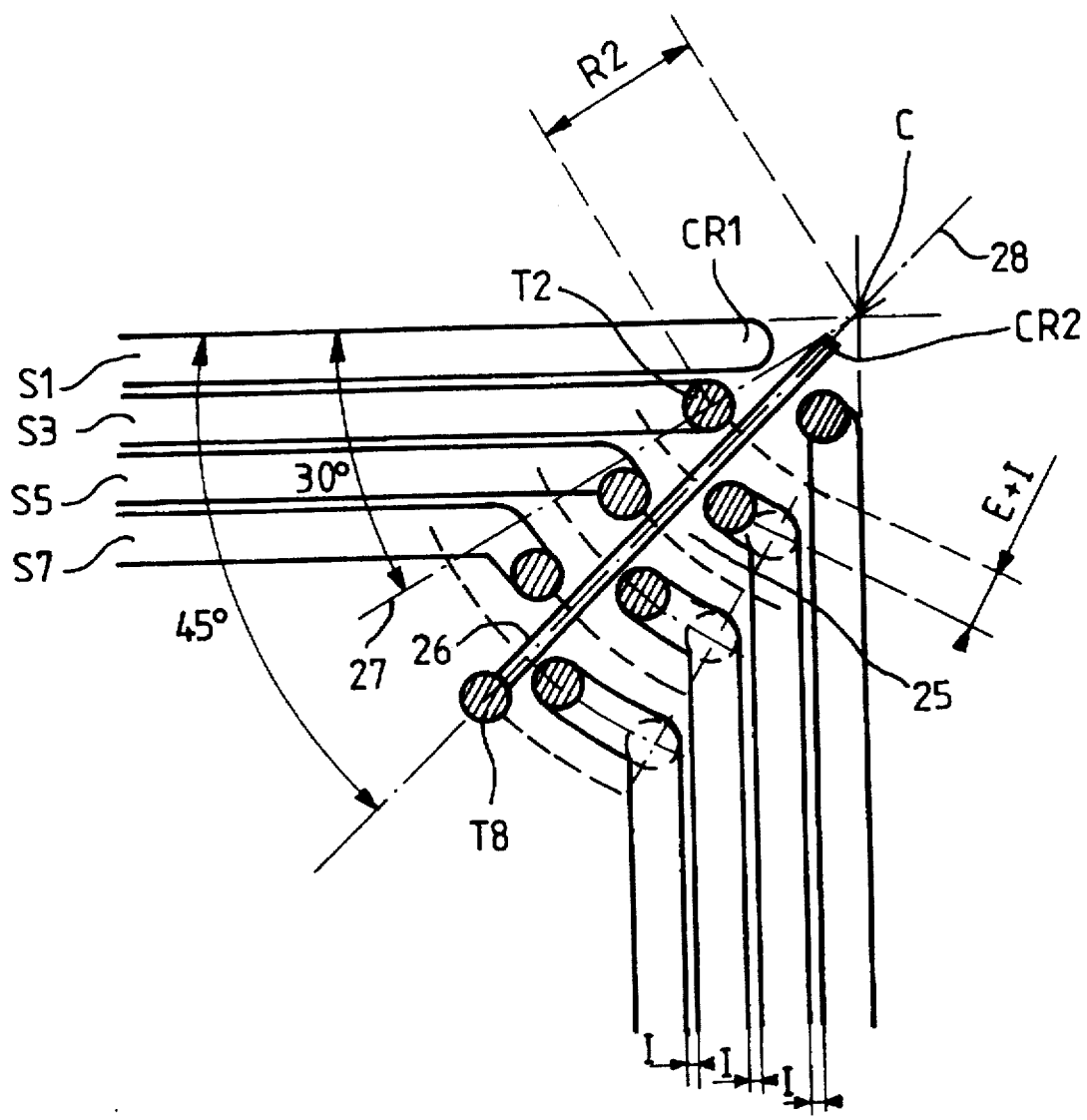

WAVE PICKUP IN THE FORM OF A PRINTED COIL FOR AN ELECTRONIC PORTABLE OBJECT SUCH AS A NO-CONTACT CARD OR BADGE

The invention relates to a portable object of the "no-contact card" or "no-contact badge" type, i.e. a portable object suitable for interchanging information with an external reader when the object is brought close thereto so as to enable electromagnetic coupling to take place without conduction. Information is then interchanged (read from and optionally written to a data memory incorporated in the object) either by radio or by varying a magnetic field produced by an induction coil.

BACKGROUND OF THE INVENTION

Examples of such portable objects include badges used for remote payment, in particular remote payment of public transport such as buses or underground railways. Nevertheless, such an application is merely an example, and such portable objects may be used in numerous other circumstances, for example controlling physical access to protected premises.

This technique is itself well known, and reference may be made for example to FR-A-2 640 830 which describes an embodiment of a portable object suitable for such an application, and to EP-A-0 565 469 which describes how data interchange is performed without making contact between a portable object and a reader.

Such a badge includes an incorporated wave pickup sensitive to the magnetic component of an electromagnetic field and implemented in the form of an integrated coil, usually a coil etched directly on a printed circuit card that also carries the various components of the electronic circuit.

The invention is particularly applicable to the case where the coil is implemented in the form of a series of turns etched on both faces of the card (or on two successive layers in the more general case of a multilayer printed circuit). Above-mentioned FR-A-2 640 830 thus includes four turns on the front face of the card and four turns on the back face of the card, overlying each other in respective pairs on opposite faces of the card.

Nevertheless, the presence of coil turns on both faces of the card presents the drawback of creating a closed outline that prevents any link being made by means of a printed track between one or more points situated within the outline and corresponding points situated outside it.

The or each link is thus implemented by an add-on conductor element or "strap". It is thus possible to add an insulated strap having tinned ends enabling it to be connected to pads of the printed circuit provided for that purpose; it is also possible to use a non-insulated strap, e.g. a length of tinned wire, in which case the printed circuit is varnished except on its pads for receiving the ends of the wire, thereby enabling the central portion of the strap to be insulated from the conductive regions of the printed circuit, and in particular the conductors forming the turns of the coil.

OBJECTS AND SUMMARY OF THE INVENTION

One of the objects of the present invention is to be able to make such a link between points inside the coil and points outside the coil without needing to add any component, with this being done by a special topology for the turns of the coil making it possible to pass conductive tracks that are etched directly on one of the faces of the printed card, and providing the corresponding advantages of simplifying the industrial process and thereby reducing the unit cost of the product.

It is thus possible to eliminate straps, thereby avoiding any problem of insulating them from the printed circuit. Also, the invention makes it possible to implement a plurality of links for identical cost, e.g. for passing power supply wires, making a connection to a center tap of the coil, etc., whereas any increase in the number of straps gives rise to a corresponding increase in production cost.

The invention thus provides a portable object of the above-specified type, i.e. comprising an electronic circuit constituted by a double-sided printed circuit card with no-contact transmission/reception means for interchanging data with a remote terminal, in which the transmission/reception means comprise a wave pickup in the form of a coil etched on the printed circuit card, the coil comprising a plurality of alternating turns etched on each of the faces of the card, with each turn being an open turn connected at each end by means of a respective via passing through the card to the corresponding adjacent end of the next turn disposed on the opposite face of the card, the successive turns thus being connected in series in alternating and concentric manner by means of a set of vias.

According to the invention, on a first face of the card, the curvilinear extents of the facing terminal regions of the turns extend beyond the midline between the ends of the turns so as to cause said terminal regions to be interdigitated in alternation, while on the opposite face of the card, the curvilinear extents of the facing terminal regions of the turns are limited so as to leave an empty gap extending approximately radially, the through connection vias being located outside said empty gap along the sides thereof, the card also having at least one etched conductor track interconnecting a point situated inside the coil and a point situated outside the coil, the track passing along the empty gap.

According to various advantageous characteristics:

the turns are substantially square or rectangular in shape, and the terminal regions of the turns extend in the vicinity of one of the corners of the square or rectangle, the midline between the ends of the turns preferably extending substantially parallel to one of the diagonals of the square or rectangle;

said point situated inside the coil is connected to the end of an inner turn of the coil, or said point situated outside the coil is connected to the end of an outer turn of the coil, in particular for connection to a terminal of the coil;

said point situated inside the coil is connected to a power supply terminal and said point situated outside the coil is connected to a terminal of the electronic circuit, or said point situated outside the coil is connected to a power supply terminal and said point situated inside the coil is connected to a terminal of the electronic circuit; and another point situated outside the coil is connected to an intermediate through connection via by an etched conductor track passing along the empty gap, in particular for the purpose of making a connection to an intermediate tap of the coil.

BRIEF DESCRIPTION OF THE DRAWINGS

Other characteristics and advantages of the invention appear on reading the following detailed description made with reference to the accompanying drawings.

FIG. 1 is a front view of an example of a no-contact badge to which the teaching of the invention can FIG. 2 is a front view of a circuit card inside such an object, showing the various conductive tracks and pads, in particular turns of a printed coil implemented in accordance with the prior art.

FIGS. 3 and 4 are views showing the configuration of a coil implementing the teaching of the invention and formed respectively in a first layer and in a second layer of a printed circuit (corresponding to the front and to the back of the card).

DETAILED DESCRIPTION

Figure 4:
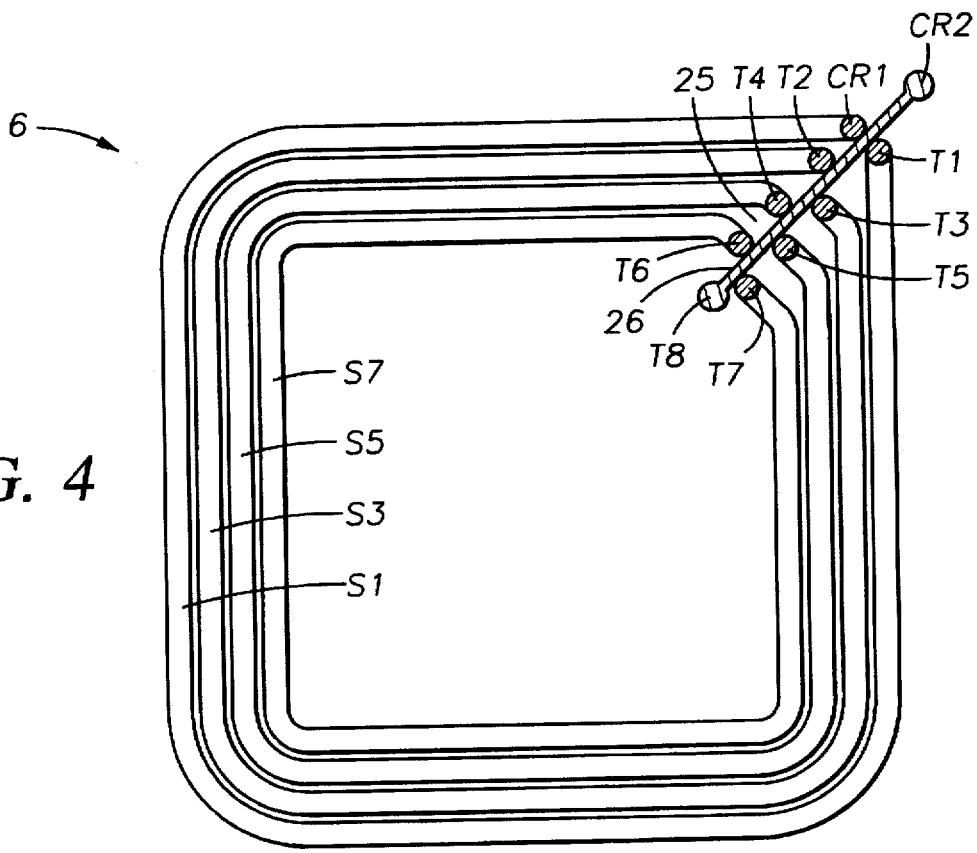

FIG. 1 shows a portable object of the badge type such as is used, for example, for remote payment of public transport. On the outside, the badge 1 merely comprises a display 2 and a pushbutton 3.

Inside, the badge has an electronic circuit implemented on a double-sided printed circuit card given reference 4 in FIG. 2 which shows the conductive tracks only, omitting the components which may be mounted on said card by surface-mount technology or optionally by chip-on-board technology (SMC or COB), for example.

In addition to various tracks 5 for interconnecting the components and the chip, the card 4 also includes a printed coil referenced 6.

In the prior art configuration shown in FIG. 2, (which corresponds to the structure described in above-mentioned FR-A-2 640 830 to which reference may be made for further details), the coil is constituted by a plurality of turns, e.g. two series of turns on respective faces, with the face visible in FIG. 2 showing turns 7, 9, 11, and 13, which turns overlie other turns 8, 10, 12, and 14 provided on the other side of the card.

By way of example, each of these turns is substantially square (or rectangular) in shape and has two ends 15 and 16 each constituting one end of a respective through connection or "via" enabling it to communicate with one end of a turn on the other side of the card so as to be extended on said other side by said turn which is of substantially the same dimensions and whose other end is situated at the location of another via passing through the thickness of the card and connected to a further turn, and so on.

The innermost turn is terminated by a contact pad 17 while the outermost turn is terminated by a contact pad 18 which, in the example shown, is connected directly to conductor tracks 5 for connecting it to the various components of the circuit. The connection between the circuit and the pad 17 is provided by means of a strap placed between the pad 17 and a pad 19, with the strap extending across the set of turns 7, 9, 11, and 13.

The central space 20 located inside the coil 6 may be used for receiving other components, and in particular a power supply battery whose two terminals are connected to pads 21 and 22 which are themselves connected by other straps to corresponding pads 23 and 24 situated outside the coil and enabling the various components of the circuit to be powered.

It will be observed that the configuration shown in which the circuits are outside the coil and the power supply is inside the coil could be inverted so that the circuits 5 are located inside the coil while the power supply is located outside, but the problem of crossing the coil by means of link straps would remain unaltered.

The invention seeks to avoid the need to use one or more straps by means of a special topology for the turns of the coil 6 that enables one or more links to be established between the inside and the outside of the coil solely by means of conductors etched on the printed circuit card.

FIGS. 3 and 4 show the two layers of the circuit that illustrate this topology, with FIG. 3 corresponding for example to the front of the card and FIG. 4 to the back thereof (the representation in the figures corresponds to superposable layers, so one of the masks for making two opposite faces of the card would need to be a mirror image of the corresponding figure).

In the example shown, the antenna is constituted by eight turns referenced S1 to S8, i.e. four turns S1, S3, S5, and S7 on one face of the circuit with the other four turns S2, S4, S6, and S8 being on the other face. The coil is made by connecting the turns together in series, alternating between turns on one face and on the other face of the card.

Essentially, provision is made on one of the faces (the face shown in FIG. 3) to leave an empty gap 25 between the facing ends of each of the turns, said gap extending radially so as to define a radial "passage" for passing one or more conductors 26. In the example shown, the conductor 26 serves to connect the end T8 of the innermost turn S8, i.e. the last turn of the coil, to a circuit component situated outside the coil 6 (which link was provided by the strap shown between pads 17 and 19 in the prior art example of FIG. 2). It will be understood that other conductors can easily be passed along this "passage", e.g. power supply lines or conductors leading to an intermediate or center tap of the coil, providing the passage is wide enough to accommodate the required insulation distances.

The coil begins at the first terminal CR1 with turn S1 which terminates at through connection T1 (FIG. 3) where a via connects it to the beginning of the second turn S2 (FIG. 4) which terminates at through connection T2 and is extended on the other side of the circuit by turn S3 (FIG. 3), and so on. The last turn S8 terminates at through connection T8 which is connected by above-mentioned conductor 26 to a point CR2 outside the loop, and constituting the second terminal of the coil 6.

The ends T1, T3, T5, and T7 lie on a first line while the ends CR1, T2, T4, and T6 lie on a second line. It will be observed that whereas these lines are spaced apart from each other on the face shown in FIG. 3 so as to leave an empty gap (that constitutes the passage 25), on the other face as illustrated in FIG. 4, the opposite configuration obtains, i.e. the ends of the respective turns are interdigitated, with the terminal region of the track terminating at through connection T2 lying between the terminal regions of the tracks terminating at through connections T1 and T3, and so on.

It will be observed that the configuration of the invention makes it easy to provide an intermediate tap on the coil by having a conductor in the empty gap connected to one of the through connections (e.g. T4, in which case CR1 is the start of the coil, T4 its center tap, and T8/CR2 the end of the coil). There are then two conductors in the gap constituting the passage 25, namely the conductor 26 connecting T8 to CR2, and an additional conductor connecting T4 to another outside point.

Figure 5:
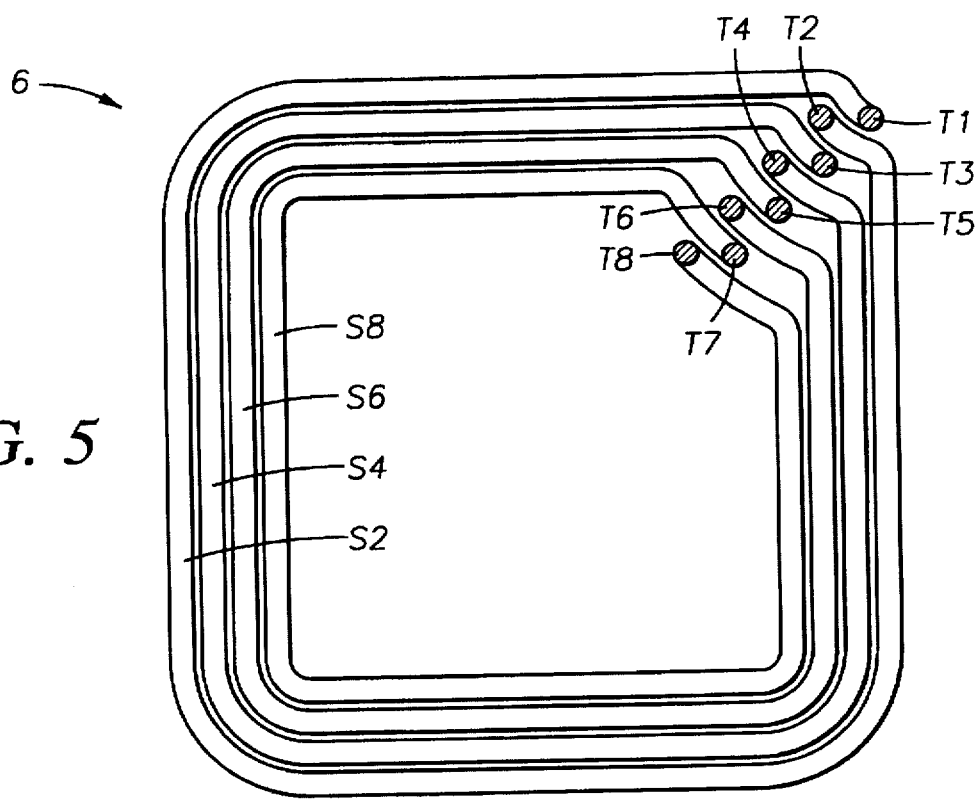
FIG. 5 is a view on a larger scale showing the top righthand corner portion of FIG. 3 and showing the special configuration of the corner in greater detail.

FIG. 5 shows in greater detail how the positions of the various through connections are determined when designing the etching mask.

Firstly the turns S1, S3, S5, and S7 are drawn concentrically with appropriate insulation distances I between adjacent turns. In the example shown, the turns are drawn to be approximately square in shape with rounded corners, and the ends of the turns are made to lie approximately along a diagonal of the square (other configurations naturally being possible).

Thereafter, the turns S2, S4, S6, and S8 are drawn on the second layer so as to overlie the turns S1, S3, S5, and S7 respectively.

The radial link 26 of width E is then drawn, preferably along one of the diagonals of the square, leaving an insulation distance I between either side of the radial conductor and the turns, thus requiring the radial gap 25 to have a width E+2×I.

Thereafter, through connection T2 is drawn as close as possible to the radial conductor 26 while leaving the appropriate insulation distance.

A straight line 27 is then drawn at an angle of 30° to the side of the square and passing through the center of the through connection T2, thereby defining a point C where said straight line 27 intersects the axis 28 of the radial conductor.

Thereafter, a circle is drawn centered on C and passing through the connection T2 to give a radius R2. The distances from the center C to the through connections T1 to T8 are then obtained from R2 by adding or subtracting some number of times (E+I) so as to give corresponding radii R1 to R8. The through connections T1 to T8 are then placed as close as possible to the radial conductor 26, after which it suffices to make connections in the form of circular arcs between through connection T1 and turns S1 and S2, through connection T2 and turns S2 and S3, and so on to through connection T7 and turns S7 and S8.

The radial conductor 26 can then be connected to the inner turn S8 via through connection T8.

The coil made in this way has its ends CR1 and CR2 situated outside the coil so they can be connected directly to the various circuits of the badge without requiring a strap to be added thereto.

In a variant, the radial conductor can be connected to the outer turn S1 so that the coil then has its two ends CR1 and CR2 located inside the coil, which configuration is appropriate when the circuits are located inside the coil instead of outside it.

I claim:

1. A portable object such as a card or a badge, the object comprising an electronic circuit constituted by a double-sided printed circuit card with no-contact transmission/reception means for interchanging data with a remote terminal, in which the transmission/reception means comprise a wave pickup in the form of a coil etched on the printed circuit card, the coil comprising a plurality of alternating turns etched on each of the faces of the card, with each turn being an open turn connected at each end by means of a respective through connector passing through the card to the corresponding adjacent end of the next turn disposed on the opposite face of the card, the successive turns thus being connected in series in alternating and concentric manner by means of a set of through connectors, wherein on a first face of the card, the curvilinear extents of the facing terminal regions of the turns extend beyond the midline between the ends of the turns so as to cause said terminal regions to be interdigitated in alternation, while on the opposite face of the card, the curvilinear extents of the facing terminal regions of the turns are limited so as to leave an empty gap extending approximately radially, the through connectors being located outside said empty gap along the sides thereof, the card also having at least one etched conductor track interconnecting a point situated inside the coil and a point situated outside the coil, the track passing along the empty gap.

2. The portable object of claim 1, in which the turns are substantially square or rectangular in shape, and the terminal regions of the turns extend in the vicinity of one of the corners of the square or rectangle.

3. The portable object of claim 2, in which the midline between the ends of the turns extends substantially parallel to one of the diagonals of the square or rectangle.

4. The portable object of claim 1, in which said point situated inside the coil is connected to the end of an inner turn of the coil, or said point situated outside the coil is connected to the end of an outer turn of the coil, in particular for connection to a terminal of the coil.

5. The portable object of claim 1, in which said point situated inside the coil is connected to a power supply terminal and said point situated outside the coil is connected to a terminal of the electronic circuit, or said point situated outside the coil is connected to a power supply terminal and said point situated inside the coil is connected to a terminal of the electronic circuit.

6. The portable object of claim 1, in which another point situated outside the coil is connected to an intermediate through connector by an etched conductor track passing along the empty gap, in particular for the purpose of making a connection to an intermediate tap of the coil.

* * * * *